United States Patent [19]
Atkins et al.

[11] Patent Number: 5,162,742
[45] Date of Patent: Nov. 10, 1992

[54] METHOD FOR LOCATING ELECTRICAL SHORTS IN ELECTRONIC SUBSTRATES

[75] Inventors: Nathan W. Atkins, Hopewell Junction, N.Y.; Philip J. Davies, Lake Worth, Fla.; Gary P. Suback, Wappingers Falls, N.Y.

[73] Assignee: International Business Machines Corporation, Armonk, N.Y.

[21] Appl. No.: 827,297

[22] Filed: Jan. 29, 1992

[51] Int. Cl.⁵ ............................................. G01R 31/08
[52] U.S. Cl. ..................... 324/523; 324/512; 324/537; 324/158 R
[58] Field of Search ............. 324/105, 713, 719, 537, 324/158 R, 158 T, 512, 522, 523

[56] References Cited

U.S. PATENT DOCUMENTS

| | | | |
|---|---|---|---|
| 3,842,346 | 10/1974 | Bobbit | 324/537 |
| 4,504,782 | 3/1985 | Zbinden | 324/73 PC |
| 4,577,149 | 11/1984 | Zbinden | 324/73 PC |
| 4,595,875 | 6/1986 | Chan et al. | 324/73 PC |
| 4,739,258 | 4/1988 | Schwarz | 324/158 R |
| 5,059,897 | 10/1991 | Aton et al. | 324/158 T |
| 5,087,874 | 2/1992 | Robinson | 324/523 |

FOREIGN PATENT DOCUMENTS

| | | | |
|---|---|---|---|
| 0120265 | 5/1988 | Japan | 324/523 |
| 1525637 | 11/1989 | U.S.S.R. | 324/523 |

OTHER PUBLICATIONS

IBM Technical Disclosure vol. 15 No. 5 Oct. 1972 Uhls 324(512).

Primary Examiner—Jack B. Harvey
Assistant Examiner—Maura K. Regan
Attorney, Agent, or Firm—Harold Huberfeld

[57] ABSTRACT

A method for locating electrical short circuits in an electronic substrate containing a plurality of conductive paths. A pair of shorted paths is identified and a current signal is applied thereto. Simultaneously, the voltage across the shorted paths is measured. The current signal is then increased in incremental steps until the voltage starts to vary nonlinearly with respect to the current signal. A temperature differential is then created between the substrate as a whole and small sectors of the substrate until the measured nonlinear relationship between current and voltage reverses in the direction of resuming a linear relationship. The small sector which caused the voltage to respond to the temperature differential is then identified, thereby identifying the approximate location of the short circuit.

8 Claims, 3 Drawing Sheets

METHOD FOR LOCATING ELECTRICAL SHORTS IN ELECTRONIC SUBSTRATES

BACKGROUND OF THE INVENTION

This invention relates generally to the locating of electrical shorts and more particularly to a method of locating electrical shorts in multi-layer ceramic electronic substrates.

In the manufacture of very large scale integrated circuits for use in high speed computers and microprocessors, a multi-layer ceramic substrate is frequently utilized to support and interconnect many integrated circuit components. Each such substrate is formed from a large number of individual unfired screened ceramic sheets containing a conductive pattern and many conductive via holes. The via holes are utilized to connect such patterns with patterns on other sheets in the substrate, particularly with certain sheets utilized to supply required voltage levels to circuit components, known as voltage planes, and to connect such patterns and voltage planes with integrated circuit components mounted on the substrate. The individual sheets are stacked to form a laminate and baked in a sintering furnace to form a ceramic brick. A high density interconnect layer is then deposited on the ceramic brick substrate and electrically connected to the substrate. The layer of high density interconnect is formed from a plurality of thin film layers each having a thickness about one fifth the thickness of a single ceramic sheet. These thin film layers perform the same function as the layers forming the ceramic brick in much less space and rely on the ceramic brick for structural support. The top surface of the substrate includes a large number of electrical contact pads. A desired array of integrated circuit components may then be mounted on the top surface of the substrate and be interconnected in a desired manner.

During this manufacturing process short circuits are occasionally created between circuit paths in the high density interconnect portion of the substrate. The existence of unwanted short circuits can be detected using known electrical test procedures. The cost of manufacturing such multi-layer ceramic substrates is very high and thus it is highly desirable to repair such short circuit defects if possible. Heretofore, however, no effective technique has been available to locate such short circuit defects so that they may be repaired. Optical inspection techniques using a microscope have proved to be quite time consuming, lasting up to fifteen hours or more, and even then without success in some instances. Heat sensitive photography has also been used by delivering a current to the short circuit and attempting to locate the short circuit through the use of infrared photography. Such attempts have suffered from the disadvantage that the shorts would frequently melt before they could be located, thus rendering the substrate useless since the melted residue of the short itself creates an unacceptable defect.

SUMMARY OF THE INVENTION

Thus the principal object of the present invention is the provision of a method for accurately locating electrical short circuits in an electronic substrate.

Another object of the present invention is the provision of a method for quickly and cost effectively locating electrical short circuits in an electronic substrate in a manner which will not damage the substrate.

Accordingly, a method is provided for locating electrical short circuits in an electronic substrate containing a plurality of conductive paths. A pair of shorted paths is identified and a signal proportional to a first electrical parameter is applied thereto. Simultaneously a second electrical parameter having a linear relationship to the first electrical parameter is measured in the pair of shorted paths. Subsequently the first electrical parameter is increased in incremental steps until the second electrical parameter starts to vary nonlinearly with respect to the first electrical parameter. A temperature differential is then created between the substrate as a whole and small sectors of the substrate until the measured nonlinear relationship between the first and second parameters reverses in the direction of resuming a linear relationship. The small sector which caused the second electrical parameter to respond to the temperature differential is then identified thereby identifying the approximate location of the short circuit.

Other objects, advantages, and novel features of the present invention will become apparent from the following detailed description of the invention when considered in conjunction with the accompanying drawings.

DESCRIPTION OF THE PREFERRED EMBODIMENTS

Figure 1:
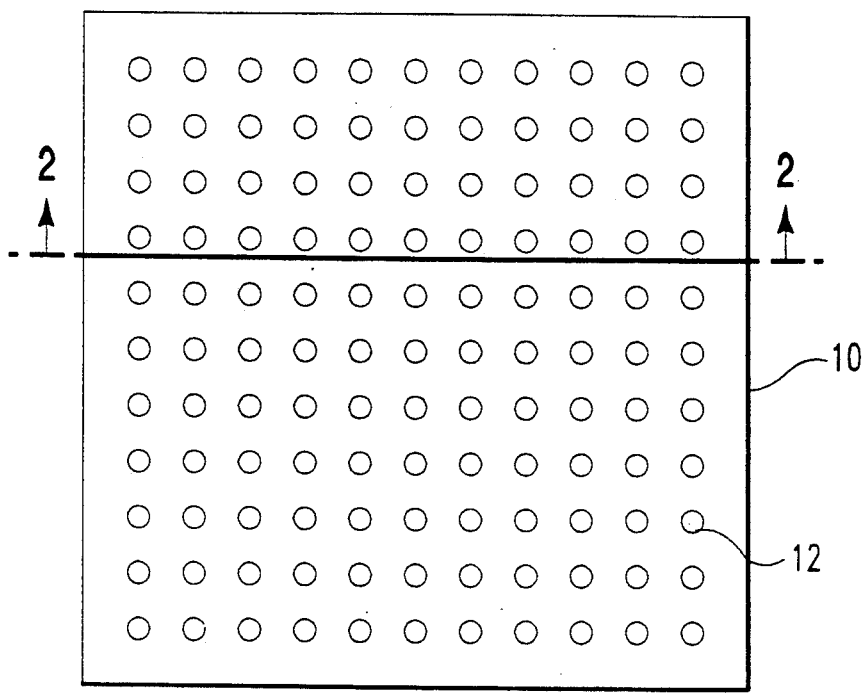
FIG. 1 shows, in diagramatic form, a top view of a multi-layer ceramic substrate on which the method of the present invention may be practiced.
Figure 2:
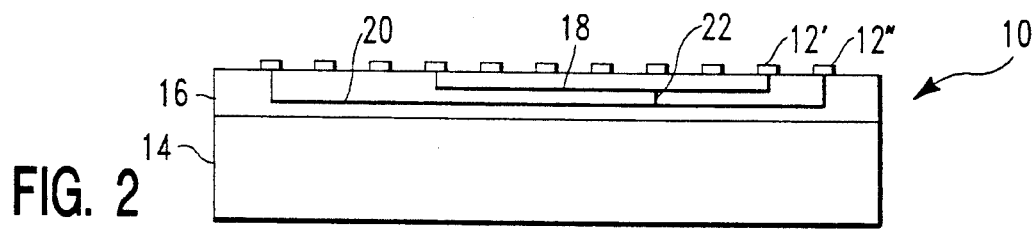
FIG 2 shows a cross section of the substrate shown in FIG. 1 taken along line 2—2.

FIG. 1 shows a multi-layer ceramic substrate 10, of the type heretofore described, having a plurality of electrical contact pads 12 on the top surface thereof. For ease of illustration, the substrate 10 has not been drawn to scale. As shown in FIG. 2, the substrate 10 includes a ceramic brick portion 14 made of many ceramic sheets and a high density portion 16 made of many thin film layers, all as previously described. The high density portion 16 includes a large number of conductive paths made of wires (horizontal paths) and vias (vertical paths). For example, conductive paths 18 and 20 are shown having a short circuit 22 therebetween. It, of course, should be noted that the short circuit 22 need not be located in close proximity to any particular pair of contact pads and may be located anywhere in the high density portion 16 of the substrate 10. It should be further noted that the individual ceramic sheets which form the ceramic brick 14 are each subjected to rigorous optical inspection prior to being fired to form the brick 14. Thus it is highly unlikely that a short circuit or any other defect would exist in the brick 14.

Completed substrates, such as the substrate 10, are routinely tested by conducting electrical tests between pairs of contact pads 12 in a known manner. Thus it is relatively easy for one skilled in the art to identify the existence of a short circuit between a pair of conductive paths. However, as was mentioned in the Background of the Invention, heretofore it has been very difficult for one to physically locate the short circuit in a manner which would enable one to retain the option of repairing the short.

Figure 6:
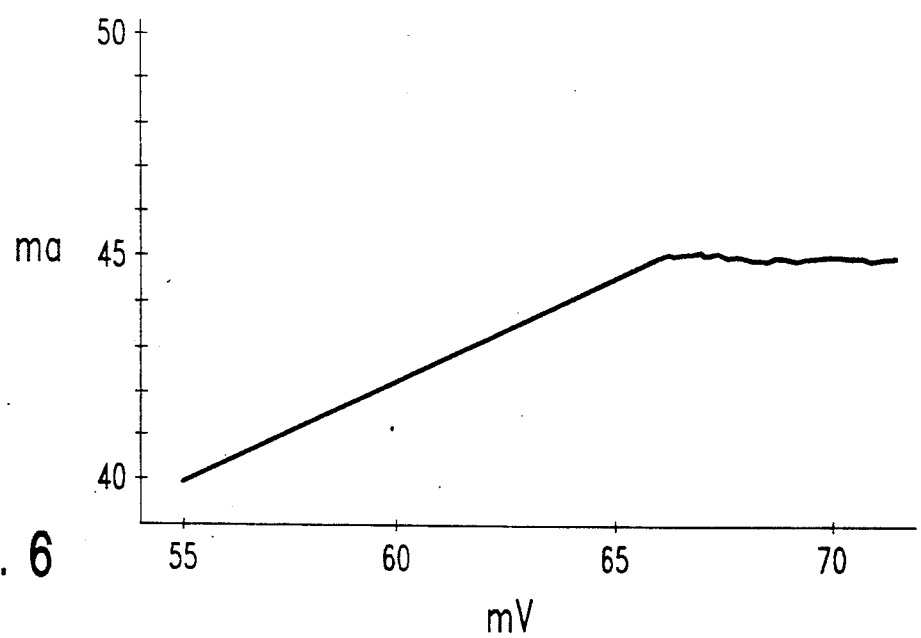
FIG. 6 shows, in graph form, a plot of current vs. voltage for the test circuit of FIG. 5.
Figure 5:
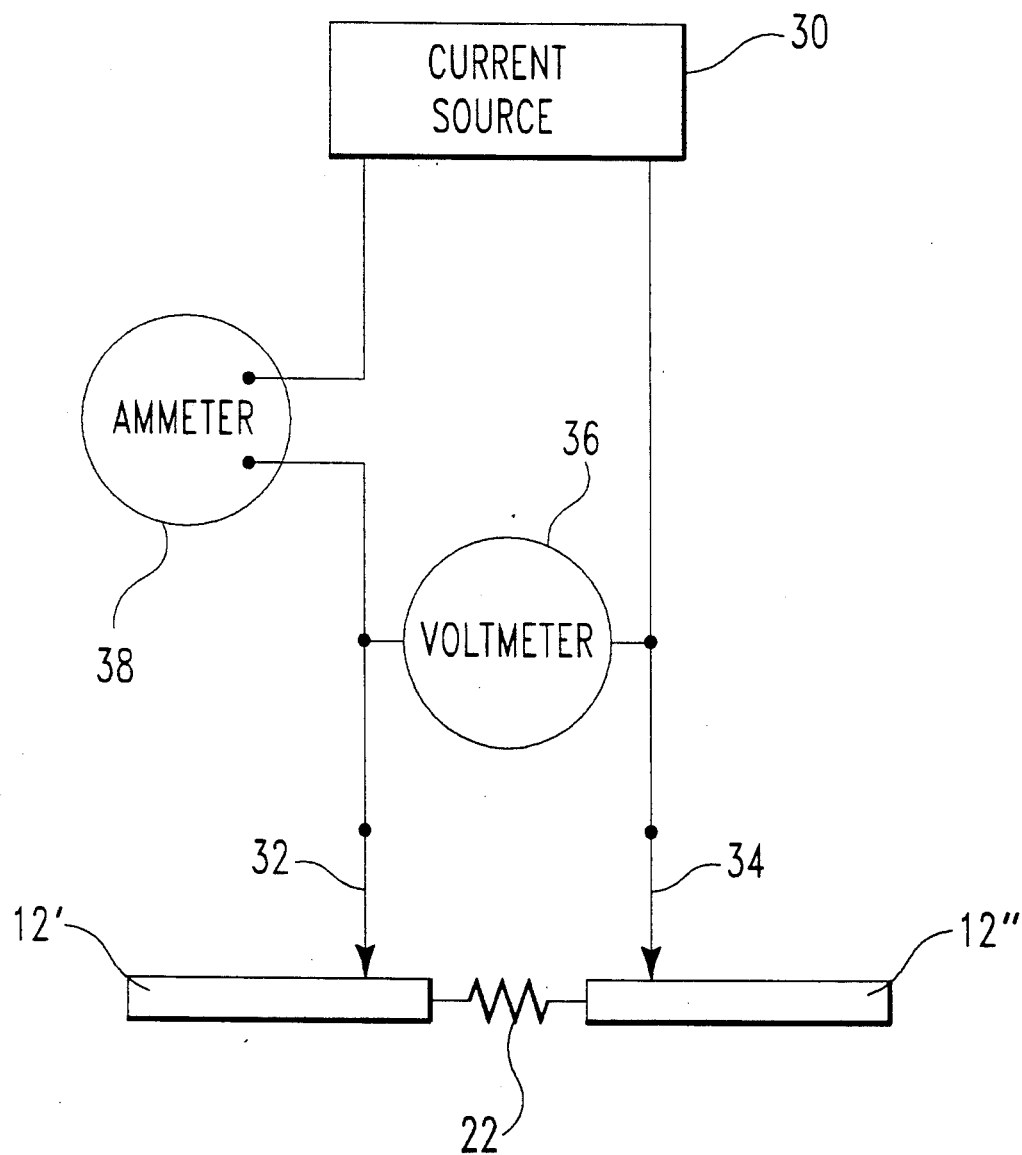
FIG. 5 shows, in schematic form, a test circuit used to practice the method of the present invention.

As is illustrated in FIGS. 2 and 5, a short circuit 22 has been identified as existing between a pair of shorted paths 18 and 20 connected to contact pads 12' and 12". The method of the present invention recognizes and relies upon the fact that nearly all such short circuits have a higher resistance than any desired circuit path. The method of the present invention may be practiced by connecting a current source 30 to the contact pads 12' and 12" through a pair of electrical probes 32 and 34. A voltmeter 36 is connected between probes 32 and 34 for measuring the voltage across the short circuit 22 and an ammeter 38 is connected between the current source 30 and the probe 32 for measuring the current flowing in the short circuit 22. As is shown in FIG. 6 a constant current is then applied to contact pads 12' and 12" from current source 30 while the current is measured by ammeter 38 and the voltage across contact pads 12' and 12" is measured by voltmeter 36. Recognizing that the relationship between the voltage, V, at voltmeter 36 and the current, I, at ammeter 38 is defined by Ohm's Law ($V = IR$), the only uncontrolled variable in the test circuit of FIG. 5 is the resistance, R, between contact pads 12' and 12". Under normal conditions this resistance would remain constant for currents within the normal operating range of the circuits being tested. However, the present invention recognizes that short circuit defects of the type created in the above-described manufacturing process will tend to increase in resistance when subjected to currents within the normal operating current range. Ultimately, when subjected to sufficient current for a sufficient length of time, these short circuit defects will melt, causing irreparable damage to the substrate.

Thus the current from current source 30 is subsequently increased in small incremental steps until the measured voltage starts to increase nonlinearly with respect to the measured current, indicating that the resistance, R, in short circuit 22 is increasing. The magnitude of the current supplied by the current source 30 and the magnitude of the incremental steps will vary in accord with the design parameters of the substrate being tested. In a typical example, as shown in; FIG. 6, the current is varied in 1 ma steps between 40 and 45 ma.

Once a nonlinear voltage reading is obtained, a temperature differential is created between the substrate 10 as a whole and small sectors of the substrate until the nonlinear relationship between the voltage, V, and the current, I, reverses in the direction of resuming a linear relationship. The small sector which caused the voltage to respond to the temperature differential is then identified to thereby identify the approximate location of the short circuit 22. The short circuit may then be repaired using known techniques.

Figure 3:
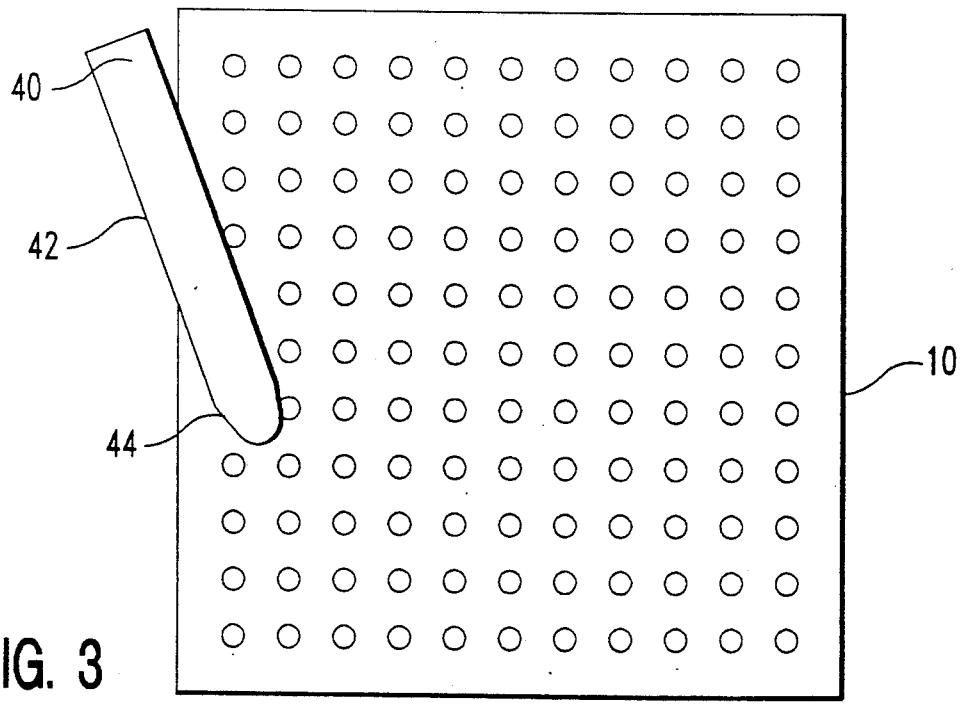
FIG. 3 shows, in diagramatic form, one embodiment of an apparatus used to practice the method of the present invention.

The temperature differential between the substrate 10 and small sectors thereof is preferably created by maintaining the substrate 10 as a whole at ambient temperature and sequentially cooling small sectors of the substrate. FIG. 3 shows a first embodiment of an apparatus for sequentially cooling small sectors of the substrate 10. A cold probe 40 preferably contains a frozen fluid, such as water at 0 degrees C. In its simplest form, the probe 40 could be an ice cube. As shown in FIG. 3 probe 40 is an instrument having sidewalls 42 and a tapered tip 44 preferably having a surface area approximately equal to the size of one integrated circuit chip site on the substrate 10. The tip 44 is adapted to contact the surface of the substrate 10 and be moved to across the surface of the substrate 10 until the voltage, V, begins to resume its linear relationship with current, I.

Figure 4:
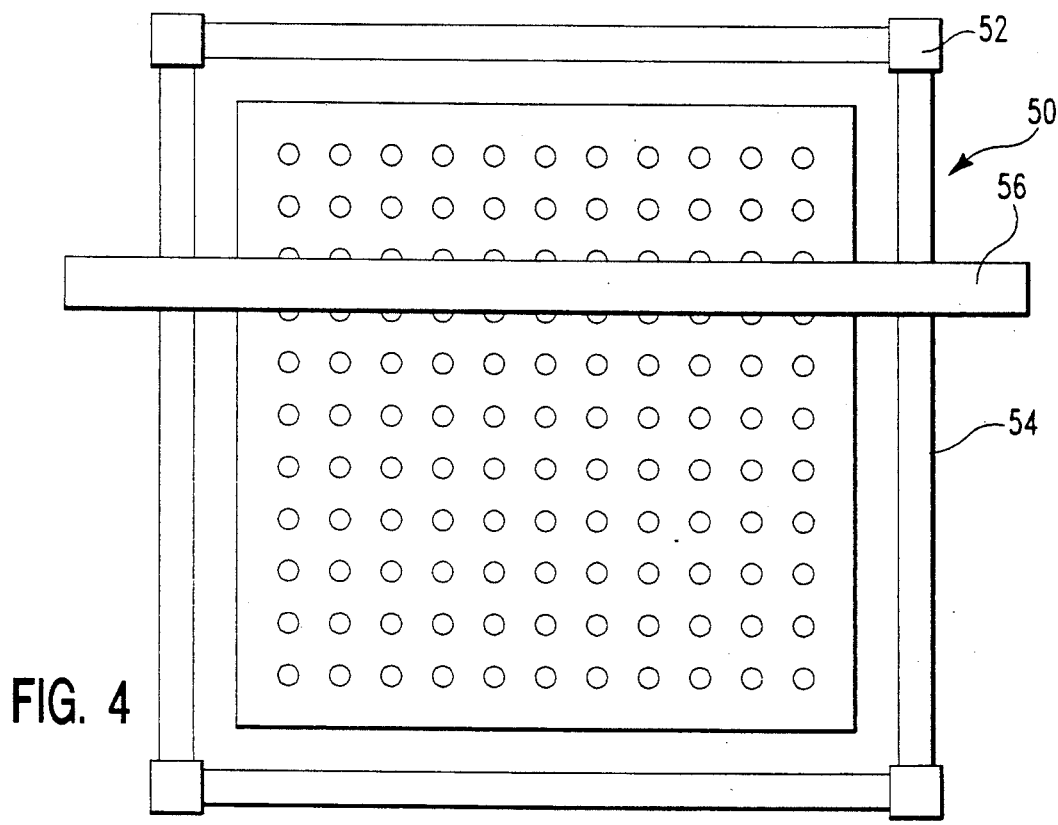
FIG. 4 shows, in diagramatic form, a second embodiment of an apparatus used to practice the method of invention.

FIG. 4 shows a second embodiment of an apparatus for sequentially cooling small sectors of the substrate 10. A square frame 50, slightly larger than the perimeter of substrate 10, surrounds the substrate 10. The frame includes four supports 52 connected by four tracks 54. A linear probe member 56 is adapted to contain a frozen liquid and to ride in tracks 54 in contact with substrate 10. The member 56 has a length sufficient to span the substrate 10 and the frame 50 and is adapted to traverse the substrate 10 in two orthogonal directions. The member 56 preferably has a width approximately equal to the width of an integrated circuit chip site. The voltage, V, is recorded during the traversal of the substrate 10 in each direction. The intersection of the positions of member 56 in each direction at which the voltage, V, begins to resume its linear relationship with current, I, yields the approximate location of the short circuit. The size of the tip 44 of probe 40 and the width of the linear probe member 56 may be set as desired. The larger the probe, the fewer the number of readings that need to be taken to locate the general area of the defect. The smaller the probe, the more accurately a defect may be located.

In the alternative in the circuit shown in FIG. 5, a voltage source may be substituted for current source 30. This alternative is particularly useful when operating at very low current levels, e.g. in the microampere range. In this embodiment nonlinearities in the current readings with respect to the supply voltage would locate the short circuit. Alternatives to the cold probes shown in FIGS. 3 and 4 are to heat the substrate 10 and utilize a probe at ambient temperature to achieve the desired temperature differential. In another alternative, the probes could be at a higher temperature than the substrate to create the desired temperature differential. The cold probing technique is preferred to minimize the risk of melting the short.

Thus the present invention provides a method for accurately, quickly and cost effectively locating short circuits in an electronic substrate in a manner which will not destroy the substrate so that it may be repaired.

While there have been described what are at present considered to be the preferred embodiments of the present invention, it will be obvious to those skilled in the art that various changes or modifications may be made therein, without departing from the invention, and it is, therefore, aimed in the appended claims to cover all those changes and modifications as follow in the true spirit and scope of the invention.

What is claimed is:

1. A method of locating electrical short circuits in an electronic substrate containing a plurality of conductive paths comprising:
   identifying a pair of shorted paths;
   applying a first electrical parameter to said pair of shorted paths;
   simultaneously measuring a second electrical parameter in said pair of shorted paths, said second electrical parameter having a linear relationship to said first electrical parameter;

subsequently increasing said first electrical parameter in incremental steps until said second electrical parameter starts to vary nonlinearly with respect to said first electrical parameter;

creating a temperature differential between said substrate as a whole and small sectors of said substrate until said measured nonlinear relationship between said first and second parameters reverses in the direction of resuming a linear relationship;

and identifying the small sector which caused said second electrical parameter to respond to said temperature differential to thereby identify the approximate location of said short circuit.

2. A method as set forth in claim 1 wherein said first electrical parameter is the current flowing in said shorted paths and said second electrical parameter is the voltage between said shorted paths.

3. A method as set forth in claim 1 wherein said first electrical parameter is the voltage between said shorted paths and said second electrical parameter is the current flowing in said shorted paths.

4. A method as set forth in claim 1 wherein said step of creating a temperature differential includes:

maintaining said substrate as a whole at ambient temperature, and sequentially cooling small sectors of said substrate.

5. A method as set forth in claim 4 wherein said step of sequentially cooling said small sectors includes probing said substrate with an instrument maintained at a temperature substantially less than said ambient temperature, said instrument having a tip adapted to contact the surface of said substrate.

6. A method as set forth in claim 5 wherein said tip has a surface area approximately equal to the size of one integrated circuit chip site on said substrate.

7. A method as set forth in claim 4 wherein said step of sequentially cooling said small sectors includes traversing said substrate in a first direction with an instrument maintained at a temperature substantially less than said ambient temperature, said instrument having a length sufficient to span said substrate, traversing said substrate in a direction perpendicular to said first direction, and recording said measured parameter during the traversing of said substrate in both directions to thereby locate said short circuit.

8. A method as set forth in claim 7 wherein said instrument has a width approximately equal to the width of an integrated circuit chip site.

* * * * *